United States Patent
Ushiki et al.

(10) Patent No.: US 8,042,976 B2
(45) Date of Patent: Oct. 25, 2011

(54) WHITE HARDENING RESIN COMPOSITION, HARDENED MATERIAL, PRINTED-WIRING BOARD AND REFLECTION BOARD FOR LIGHT EMITTING DEVICE

(75) Inventors: Shigeru Ushiki, Saitama (JP); Yoshikazu Daigo, Saitama (JP)

(73) Assignee: Taiyo Holdings Co., Ltd., Tokyo (JP)

( * ) Notice: Subject to any disclaimer, the term of this patent is extended or adjusted under 35 U.S.C. 154(b) by 396 days.

(21) Appl. No.: 12/323,984

(22) Filed: Nov. 26, 2008

(65) Prior Publication Data
US 2009/0141504 A1 Jun. 4, 2009

(30) Foreign Application Priority Data
Nov. 30, 2007 (JP) .................. 2007-311548

(51) Int. Cl.
*F21V 7/22* (2006.01)

(52) U.S. Cl. .................. 362/341; 362/296.01
(58) Field of Classification Search .......... 362/341, 362/296.01, 296.02, 296.04
See application file for complete search history.

(56) References Cited

U.S. PATENT DOCUMENTS

| | | | |
|---|---|---|---|
| 6,281,277 B1 * | 8/2001 | Ishii et al. | 524/444 |
| 7,169,327 B2 * | 1/2007 | Ito et al. | 252/500 |
| 7,939,591 B2 * | 5/2011 | Tomoda | 524/284 |
| 2006/0155005 A1 * | 7/2006 | Kondo et al. | 523/160 |
| 2007/0030667 A1 * | 2/2007 | Watanabe et al. | 362/97 |

FOREIGN PATENT DOCUMENTS
JP 2007-249148 9/2007
* cited by examiner

*Primary Examiner* — David V Bruce
(74) *Attorney, Agent, or Firm* — Ditthavong Mori & Steiner, P.C.

(57) ABSTRACT

A white hardening resin composition includes a hardening resin and rutile-type titanium oxide produced by a chlorine method.

11 Claims, 3 Drawing Sheets

WHITE HARDENING RESIN COMPOSITION, HARDENED MATERIAL, PRINTED-WIRING BOARD AND REFLECTION BOARD FOR LIGHT EMITTING DEVICE

CROSS-REFERENCE TO RELATED APPLICATIONS

The present application claims priority under 35 U.S.C. §119 to Japanese Patent Application No. 2007-311548, filed Nov. 30, 2007. The contents of this application are incorporated herein by reference in their entirety.

BACKGROUND OF THE INVENTION

1. Field of the Invention

The present invention relates to a white hardening resin composition, a hardened material, a printed-wiring board including the hardened material, and a reflection board for light emitting devices including the hardened material.

2. Discussion of the Background

In printed-wiring boards, there have been recently increased applications of use that LED emitting by a low electric power in a backlight of liquid crystal display for mobile terminals, personal computers and televisions and the like, or a light source of lighting equipment is directly mounted. See, for example, the paragraphs [0002] to [0007] of Japanese Unexamined Patent Publication No. 2007-249148. The contents of Japanese Unexamined Patent Publication No. 2007-249148 are incorporated herein by reference in their entirety.

In this case, regarding an insulation film coated and formed as a protective film in a printed-wiring board, in addition to characteristics such as solvent resistance, hardness, solder resistance and electrical insulating properties generally required in a solder resist film, an excellent light reflectivity capable of utilizing emission of LED effectively has been desired.

However, a white solder resist composition conventionally used has had a problem that oxidation of resin due to light and heat irradiated by LED proceeds to turn yellow, lowering reflectivity with time.

SUMMARY OF THE INVENTION

According to one aspect of the present invention, a white hardening resin composition includes rutile-type titanium oxide produced by a chlorine method, and a hardening resin.

According to another aspect of the present invention, a hardened material includes a substrate and a white hardened resin. The white hardened resin is provided on the substrate in such a manner that a white hardening resin composition coated on the substrate is hardened to be the white hardened resin. The white hardening resin composition includes rutile-type titanium oxide produced by a chlorine method, and a hardening resin.

According to further aspect of the present invention, a printed-wiring board includes an insulation layer including the hardened material as described above.

According to the other aspect of the present invention, a reflection board for light emitting device includes the hardened material as described above.

A white hardening resin composition according to an embodiment of the present invention can maintain a high reflectivity for a long period of time, so in the case that it is used as an insulation layer in a printed-wiring board mounted with light emitting devices such as LED, it can utilize light of LED and the like efficiently, which can raise lighting intensity as a whole for a long time. The white hardening resin composition according to the present invention is not limited to a printed-wiring board, and alternatively used as components required with a high reflectivity, for example, as a reflection board for light emitting devices such as EL and LED.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3A-3D are schematic diagrams of a part of production process for a printed-wiring board mounted with light emitting devices as a pattern diagram, and FIGS. 3A and 3B are the top plan views thereof and FIGS. 3C and 3D are the side views thereof;

DESCRIPTION OF THE EMBODIMENTS

Embodiments will now be described with reference to the accompanying drawings, wherein like reference numerals designate corresponding or identical elements throughout the various drawings.

The white hardening resin composition according to an embodiment of the present invention contains (A) rutile-type titanium oxide produced by a chlorine method and (B) a hardening resin.

In the embodiment of the present invention, as a white pigment, it is characterized by using (A) rutile-type titanium oxide produced by a chlorine method. Anatase-type titanium oxide of the same titanium oxide is high in whiteness compared with rutile-type titanium oxide, and often used as a white pigment. However, since anatase-type titanium oxide has a photocatalytic activity, change in color of a resin in an insulating resin composition is sometimes caused by a light irradiated from LED in particular. In contrast to this, rutile-type titanium oxide has almost no photoactivation although whiteness is somewhat inferior to the anatase-type, so deterioration (yellowing) of a resin resulting from photoactivation of titanium oxide is markedly suppressed, showing an excellent stability to light.

In the case that the white hardening resin composition according to the embodiment of the present invention is used in a reflection board for light emitting devices such as EL and LED, the lowering of reflectivity with time and coloring due to deterioration are suppressed, so that a high reflectivity can be maintained for a long time.

In the same rutile-type titanium oxide, rutile-type titanium oxide produced by a chlorine method has an excellent suppression effect on deterioration (yellowing) of resin particularly due to heat compared with the rutile-type titanium oxide produced by a sulfuric acid method, so it is used as a white pigment in the embodiment of the present invention. Namely, as the production method of rutile-type titanium oxide, there are two kinds of sulfuric acid method and chlorine method, the sulfuric acid method uses ilmenite ore or titanium slag as a raw material, which is dissolved in concentrated sulfuric acid to separate iron as iron sulfate, and the solution is hydrolyzed to obtain precipitate of hydroxide, and this is fired at high temperature to take out rutile-type titanium oxide. On the other hand, the chlorine method uses synthetic rutile or natural rutile as a raw material, which is reacted with chlorine gas and carbon at a high temperature of 1000° C. to synthesize titanium tetrachloride, and this is oxidized to take out rutile-type titanium oxide. It was found that the rutile-type titanium oxide produced by either method shows an excellent stability to light and heat, and an insulation layer in a printed-wiring board mounted with LED and the like can maintain a high reflectivity for a long time, but in particular, the one produced by the chlorine method is more excellent in suppression effect on deterioration of resin due to heat than the one produced by the sulfuric acid method, and it is more preferable as a white pigment in the embodiment of the present invention.

As (A) rutile-type titanium oxide produced by a chlorine method according to the embodiment of the present invention, one conventionally known can be used, as the rutile-type titanium oxide commercially available, for example, there are Tipaque CR-50, Tipaque CR-57, Tipaque CR-80, Tipaque CR-90, Tipaque CR-93, Tipaqueb CR-95, Tipaque CR-97, Tipaque CR-60, Tipaque CR-63, Tipaque CR-67, Tipaque CR-58, Tipaque CR-85 and Tipaque UT771 (manufactured by Ishihara Sangyo Kaisha Ltd.), Ti-Pure R-100, Ti-Pure R-101, Ti-Pure R-102, Ti-Pure R-103, Ti-Pure R-104, Ti-Pure R-105, Ti-Pure R-108, Ti-Pure R-900, Ti-Pure R-902, Ti-Pure R-960, Ti-Pure R-706 and Ti-Pure R-931 (manufactured by DuPont Corporation) and the like.

The compounding ratio of rutile-type titanium oxide (A) according to the embodiment of the present invention is preferably 30 to 600 parts by mass, and more preferably 50 to 500 parts by mass, relative to 100 parts by mass of hardening resin (B). When the compounding ratio of the rutile-type titanium oxide (A) exceeds 600 parts by mass, dispersibility of the titanium oxide (A) deteriorates so that dispersion becomes bad, which is not preferable. On the other hand, when the compounding ratio of the rutile-type titanium oxide (A) is less than 30 parts by mass, it is not preferable because hiding power becomes small and it becomes difficult to obtain an insulation film of high reflectivity.

Next, (B) a hardening resin is explained.

(B) the hardening resin used in the embodiment of the present invention is a heat hardening resin (B-1), or a light hardening resin (B-2), and may be a mixture thereof.

As (B-1) a heat hardening resin, it may be a resin showing electrical insulating properties after being hardened by heating, for example, there are listed an epoxy compound, an oxetane compound, a melamine resin, a silicone resin and the like. In particular, an epoxy compound and/or an oxetane compound are preferably used in the embodiment of the present invention.

As the epoxy resin, commonly known and used compounds having at least one epoxy group can be used, above all, compounds having two or more epoxy groups are preferable. For example, there are listed monoepoxy compounds such as butyl glycidyl ether, phenyl glycidyl ether and glycidyl(meth)acrylate; and compounds having two or more epoxy groups in a molecule such as a bisphenol A type epoxy resin, bisphenol S type epoxy resin, bisphenol F type epoxy resin, phenol novolac type epoxy resin, cresol novolac type epoxy resin, alicyclic epoxy resin, trimethylolpropane polyglycidyl ether, phenyl-1,3-diglycidyl ether, biphenyl-4,4'-diglycidyl ether, 1,6-hexanediol diglycidyl ether, diglycidyl ether of ethylene glycol or propylene glycol, sorbitol polyglycidyl ether, tris(2,3-epoxypropyl)isocyanurate and triglycidyl tris(2-hydroxyethyl)isocyanurate.

These can be used alone or in combination of two kinds or more upon request of improvement on characteristics of coated film.

Next, the oxetane compound is explained.

As a concrete example of oxetane compound containing an oxetane ring expressed by the following general formula (I), (I)

(wherein R1 represents a hydrogen atom or an alkyl group having carbon numbers of 1 to 6.)

there are listed 3-ethyl-3-hydroxymethyloxetane (trade name OXT-101 manufactured by Toagosei Co., Ltd.), 3-ethyl-3-(phenoxymethyl)oxetane (tradename OXT-211 manufactured by Toagosei Co., Ltd.), 3-ethyl-3-(2-ethylhexyloxymethyl)oxetane (trade name OXT-212 manufactured by Toagosei Co., Ltd.), 1,4-bis{[(3-ethyl-3-oxetany)methoxy]methyl}benzene (trade name OXT-121 manufactured by Toagosei Co., Ltd.), bis(3-ethyl-3-oxetanylmethyl)ether (trade name OXT-221 manufactured by Toagosei Co., Ltd.) and the like. Further, a phenol novolac type oxetane compound and the like are listed.

The oxetane compound can be used in concomitant use of the epoxy compound or alone.

Next, (B-2) a light hardening resin is explained. As the light hardening resin (B-2) usable in the embodiment of the present invention, it may be a resin showing electrical insulating properties after being hardened by irradiation of an active energy ray, in particular, a compound having at least one ethylenically unsaturated bond in a molecule is preferably used in the embodiment of the present invention.

As a compound having an ethylenically unsaturated bond, commonly known and used photopolymerizable oligomers, photopolymerizable vinyl monomers and the like are used.

As the photopolymerizable oligomers, unsaturated polyester type oligomers, (meth)acrylate type oligomers and the like are listed. As the (meth)acrylate type oligomers, there are listed epoxy(meth)acrylate such as phenol novolac epoxy (meth)acrylate, cresol novolac epoxy(meth)acrylate and bisphenol type epoxy(meth)acrylate; urethane(meth)acrylate, epoxy urethane(meth)acrylate, polyester(meth)acrylate, polyether(meth)acrylate, polybutadiene-modified (meth) acrylate and the like.

Additionally, in the present specification, (meth)acrylate is a generic term of acrylate, methacrylate and a mixture thereof, and other similar expression is the same as above.

As the photopolymerizable vinyl monomers, there are listed commonly known and used ones, for example, styrene derivatives such as styrene, chlorostyrene and α-methylstyrene; vinyl esters such as vinyl acetate, vinyl butyrate and vinyl benzoate; vinyl ethers such as vinyl isobutyl ether, vinyl n-butyl ether, vinyl t-butyl ether, vinyl n-amyl ether, vinyl isoamyl ether, vinyl n-octadecyl ether, vinyl cyclohexyl ether, ethylene glycol monobutyl vinyl ether and triethylene glycol monomethyl vinyl ether; (meth)acrylamides such as acrylamide, methacrylamide, N-hydroxymethylacrylamide, N-hydroxymethylmethacrylamide, N-methoxymethylacrylamide, N-ethoxymethylacrylamide and N-butoxymethylacrylamide; allyl compounds such as triallyl isocyanurate, dially phthalate, and diallyl isophthalate; esters such as 2-ethylhexyl(meth)acrylate, lauryl meth(acrylate), tetrahydrofurfuryl(meth)acrylate, isoboronyl(meth)acrylate, phenyl(meth)acrylate and phenoxyethyl(meth)acrylate; hydroxyalkyl (meth)acrylates such as hydroxyethyl(meth)acrylate, hydroxypropyl(meth)acrylate and pentaerythritol tri(meth) acrylate; alkoxyalkylene glycol mono(meth)acrylates such as methoxyethyl(meth)acrylate and ethoxyethyl meth(acrylate); alkylene polyol poly(meth)acrylates such as ethylene glycol di(meth)acrylate, butanediol di(meth)acrylate, neopentyl glycol di(meth)acrylate, 1,6-hexanediol di(meth)acrylate, trimethylolpropane tri(meth)acrylate, pentaerythritol tetra(meth)acrylate and dipentaerythritol hexa(meth)acrylate; polyoxyalkylene glycol poly(meth)acrylates such as diethylene glycol di(meth)acrylate, triethylene glycol di(meth)acrylate, ethoxylated trimethylolpropane triacrylate and propoxylated trimethylolpropane tri(meth)acrylate; poly (meth)acrylates such as neopentyl glycol hydroxypivalate di(meth)acrylate; and isocyanurate type poly(meth)acrylates such as tris[(meth)acryloxyethyl]isocyanurate.

These can be used alone or in combination of two kinds or more upon request on characteristics of coated film.

In the white hardening resin composition according to the embodiment of the present invention, in the case of preparing a photosensitive resin composition of alkali development type, it is possible to use a compound that a carboxylic group was introduced in the light hardening resin (B-2) as the light hardening resin (B-2), or a carboxyl group-containing resin having no ethylenically unsaturated bond in addition to the light hardening resin (B-2).

In the white hardening resin composition according to the embodiment of the present invention, in the case of using a light hardening resin (B-2), it is preferable to add (C) a photopolymerization initiator. As this (C) photopolymerization initiator, there are listed benzoin compounds and their alkyl ethers such as benzoin, menzoin methyl ether, benzoin ethyl ether, benzoin isopropyl ether, benzoin isobutyl ether and benzyl methyl ketal; acetophenones such as acetophenone, 2,2-dimethoxy-2-phenylacetophenone, 2-hydroxy-2-methyl-1-phenylpropan-1-one, diethoxyacetophenone, 2,2-diethoxy-2-phenylacetophenone, 1,1-dichloroacetophenone, 1-hydroxycyclohexyl phenyl ketone and 2-methyl-1-[4-(methylthio)phenyl]-2-morpholinopropan-1-one; anthraquinones such as methylanthraquinone, 2-ethylanthraquinone, 2-tert-butylanthraquinone, 1-chloroanthraquinone and 2-amylanthraquinone; thioxanthones such as thioxanthone, 2,4-diethylthioxanthone, 2-chlorothioxanthone, 2,4-dichlorothioxanthone, 2-methylthioxanthone and 2,4-diisopropylthioxanthone; ketals such as acetophenone dimethyl ketal and benzyl dimethyl ketal; and benzophenones such as benzophenone and 4,4-bismethylaminobenzophenone. These can be used alone or in mixture of 2 kinds or more, further, can be used in combination of photopolymerization-initiating auxiliaries including tertiary amines such as triethanolamine and methyldiethanolamine; benzoic acid derivatives such as 2-dimethylaminoethylbenzoic acid and ethyl 4-dimethylaminobenzoate.

The compounding ratio of photopolymerization initiator (C) may be a quantitative ratio ordinarily used, for example, and is preferably 0.1 to 20 parts by mass, and more preferably 1 to 10 parts by mass, relative to 100 parts by mass of light hardening resin (B-2).

In the white hardening resin composition according to the embodiment of the present invention, (D-1) a hardener and/or (D-2) a curing catalyst can further be added in the case of using a heat hardening resin (B-1).

As the hardener (D-1), there are listed a multifunctional phenol compound, polycarboxylic acid and its acid anhydride, aliphatic or aromatic, primary or secondary amine, polyamide resin, polymercapto compound and the like. Among these, a multifunctional phenol compound, polycarboxylic acid and its acid anhydride are preferably used from the points of workability and insulation properties.

Among these hardeners (D-1), a multifunctional phenol compound may be a compound having two or more phenolic hydroxyl groups in a molecule, and can use commonly known and used ones. Specifically, there are listed a phenol novolac resin, a cresol novolac resin, bisphenol A, allylated bisphenol A, bisphenol F, a novolac resin of bisphenol A, a vinylphenol copolymerized resin and the like, in particular, a phenol novolac resin is preferable because reactivity is high and the effect of enhancing heat resistance is also high. Such multifunctional phenol compound undergoes addition reaction with the epoxy compound and/or oxetane compound under the presence of a suitable curing catalyst.

The polycarboxylic acid and its acid anhydride are a compound having two or more carboxylic groups in a molecule and its acid anhydride, for example, copolymer of (meth) acrylic acid, copolymer of maleic anhydride, condensate of dibasic acid and the like are listed. As the commercial product, there are listed Joncryl (name of product group) manufactured by BASF Corporation, SMA resin (name of product group) manufactured by Sartmer Company Ltd., polyazelaic acid anhydride manufactured by New Japan Chemical Co., Ltd. and the like.

The compounding ratio of the hardener (D-1) may be a quantitative ratio ordinarily used, and is preferably 1 to 200 parts by mass, and more preferably 10 to 100 parts by mass, relative to 100 parts by mass of heat hardening resin (B-1).

Next, a curing catalyst (D-2) is explained.

This curing catalyst (D-2) is a compound which can be a curing catalyst in a reaction of an epoxy compound and/or an oxetane compound with the (D-1) hardener, or a compound which becomes a polymerization catalyst when no hardener is used, for example, there are listed tertiary amine, tertiary amine salt, quaternary onium salt, tertiary phosphine, crown ether complex, phosphonium ylide and the like, arbitrarily from these, they can be used alone or in combination of two kinds or more thereof.

Among these, as preferable ones, there are listed imidazoles such as trade names 2E4MZ, C11Z, C17Z and 2PZ; AZINE compounds of imidazole such as trade names 2MZ-A and 2E4MZ-A; isocyanurate of imidazole such as trade names 2MZ-OK and 2PZ-OK; and hydroxymethyl substance of imidazole such as trade names 2PHZ and 2P4MHZ (the is all trade names of Shikoku Chemicals Corporation), dicyandiamide and the derivatives, melamine and the derivatives, diaminomaleonitrile and the derivatives, amines such as diethylenetriamine, triethylenetetramine, tetraethylenepentamine, bis(hexamethylene)triamine, triethanolamine, diaminodiphenylmethane and organic acid dihydrazide, 1,8-diazabicyclo[5,4,0]undecene-7 (trade name DBU, manufactured by San-Apro Ltd.), 3,9-bis(3-aminopropyl)-2,4,8,10-tetraoxaspiro[5,5]-undecane (trade name ATU, manufactured by Ajinomoto Co., Ltd.) or organic phosphine compounds such as triphenyl phosphine, tricyclohexyl phosphine, tributyl phosphine and methyl diphenyl phosphine.

The compounding ratio of the curing catalysts (D-2) may be a quantitative ratio ordinarily used, and is preferably 0.05 to 10 parts by mass, and more preferably 0.1 to 3 parts by mass, relative to 100 parts by mass of heat hardening resin (B-1).

The white heat-hardening resin composition according to the embodiment of the present invention can contain an organic solvent used for preparation of composition and adjustment of viscosity. As the organic solvent, for example, there can be used ketones such as methyl ethyl ketone and cyclohexanone; aromatic hydrocarbons such as toluene, xylene and tetramethylbenzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether and tripropylene glycol monomethyl ether; esters such as ethyl acetate, butyl acetate, butyl lactate, cellosolve acetate, butyl cellosolve acetate, carbitol acetate, butyl carbitol acetate, propylene glycol monomethyl ether acetate, dipropylene glycol monomethyl ether acetate and propylene carbonate; aliphatic hydrocarbons such as octane and decane; and petroleum based solvents such as petroleum ether, petroleum naphtha and solvent naphtha. These organic solvents can be used alone or in combination of two kinds or more thereof.

The white heat-hardening resin composition according to the embodiment of the present invention can further compound, if necessary, commonly known and used polymerization inhibitors such as hydroquinone, hydroquinone monomethyl ether, t-butyl catechol, pyrogallol and phenothiazine; commonly known and used thickeners such as finely-powdered silica, organic bentonite and montmorillonite; and commonly known and used additives including defoaming agents and/or leveling agents of silicone type, fluorine type and polymer type etc., silane coupling agents of imidazole type, thiazole type and triazole type etc., and can compound coloring agents in a range not damaging whiteness of the heat-hardening resin composition according to the embodiment of the present invention.

The white heat-hardening resin composition according to the embodiment of the present invention is coated on a substrate by a method such as screen printing method after adjusting its viscosity to be suitable for a coating method with the solvent. After coating, a hardened coat can be obtained, for example, through light hardening by irradiation of active energy rays or through thermal hardening by heating at a temperature of 140° C. to 180° C.

The white hardening resin composition according to the present invention is not limited to a printed-wiring board, and alternatively used as components required with a high reflectivity, for example, as a reflection board for light emitting devices such as EL and LED.

FIGS. 1 to 5 show examples of use when the white hardening resin composition is used to a reflection board for light emitting devices such as LED and EL.

Figure 1:
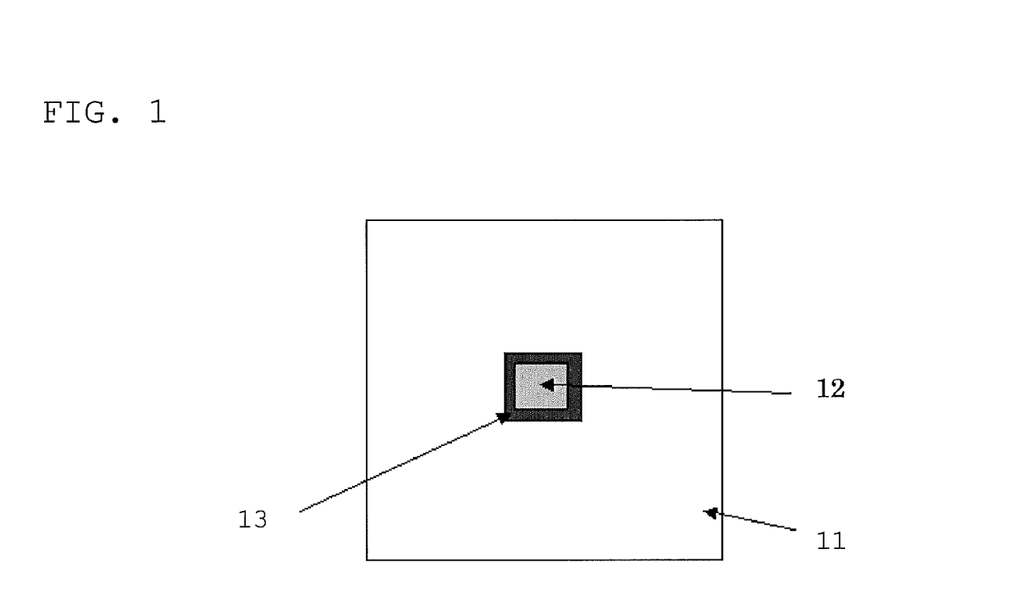
FIG. 1 is a top plan view schematically showing a printed-wiring board mounted with light emitting devices.
Figure 2:
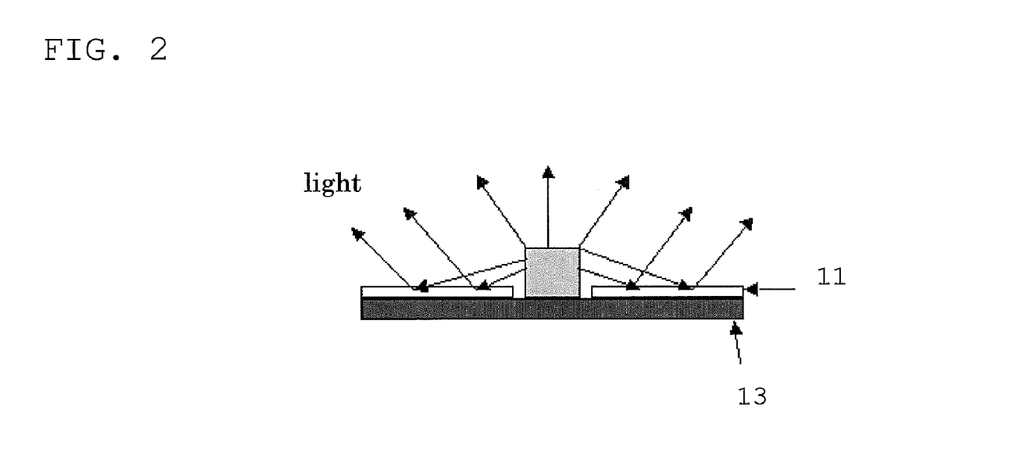
FIG. 2 is a side view schematically showing a printed-wiring board mounted with light emitting devices.

FIGS. 1 and 2 are a mode that a white hardening resin composition itself, which is an insulation material of the outermost layer of a printed-wiring board mounted with light emitting devices, is used as a white resist material with a high reflectivity.

FIG. 1 is a top plan view of the printed-wiring board. FIG. 2 is a side view of the printed-wiring board.

FIGS. 3A-3D show the following processes.

Figure 3A:
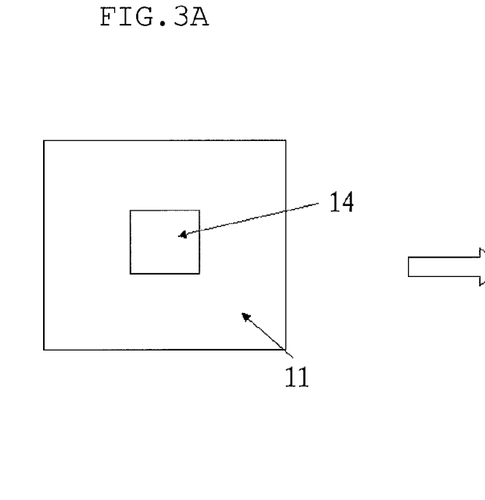
Figure 3B:
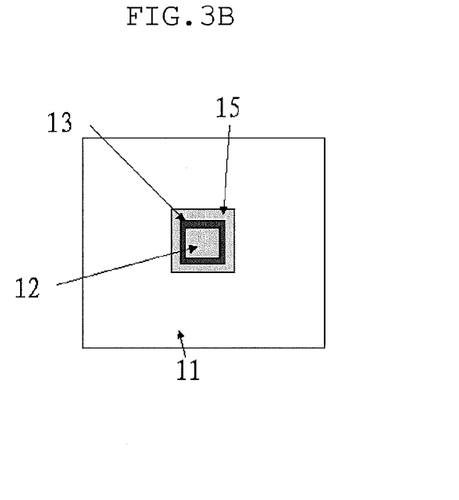
Figure 3C:
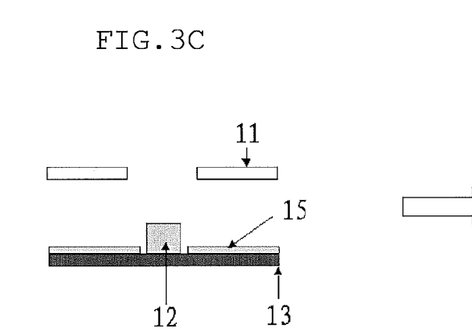

Namely, as a solder resist material for directly coating on a printed-wiring board, colored one such as green or white is used, and the solder resist layer is processed in such manner that a light emitting device mounted on a printed-wiring board is bored (see FIGS. 3A and 3C).

Figure 3D:
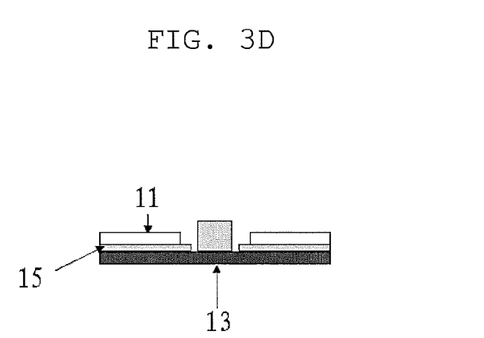

A white hardening resin composition is coated on a plastic or metal sheet, and the plastic or sheet is processed in such manner that the part corresponding to a light emitting device is bored in a similar way to that of the solder resist layer (see FIGS. 3B and 3D).

The processed plastic or sheet is thus overlapped on a printed-wiring board. As a result, it seemed that a white hardening resin composition with a high reflectivity is formed on the outermost layer.

Figure 4:
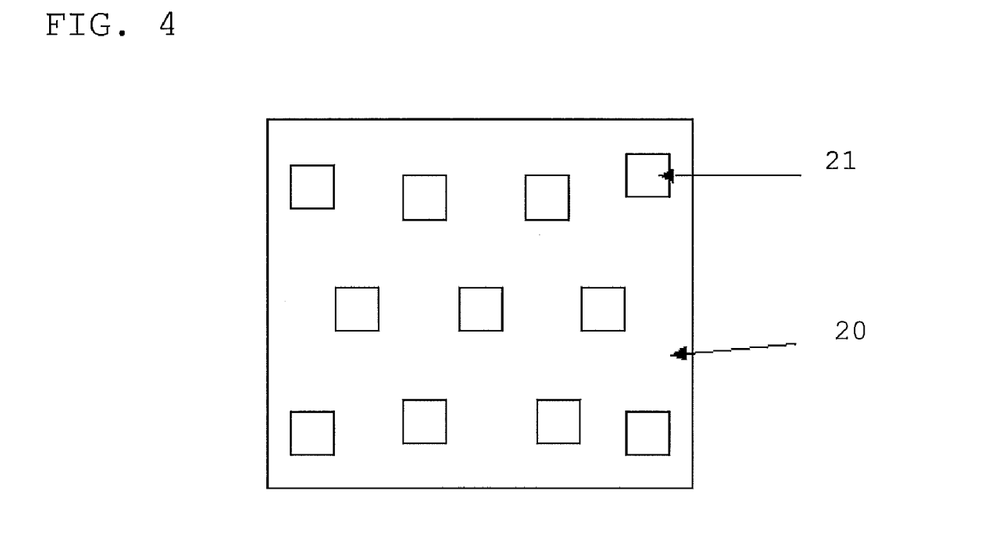
FIG. 4 is a top plan view schematically showing a reflection board for light emitting device.
Figure 5:
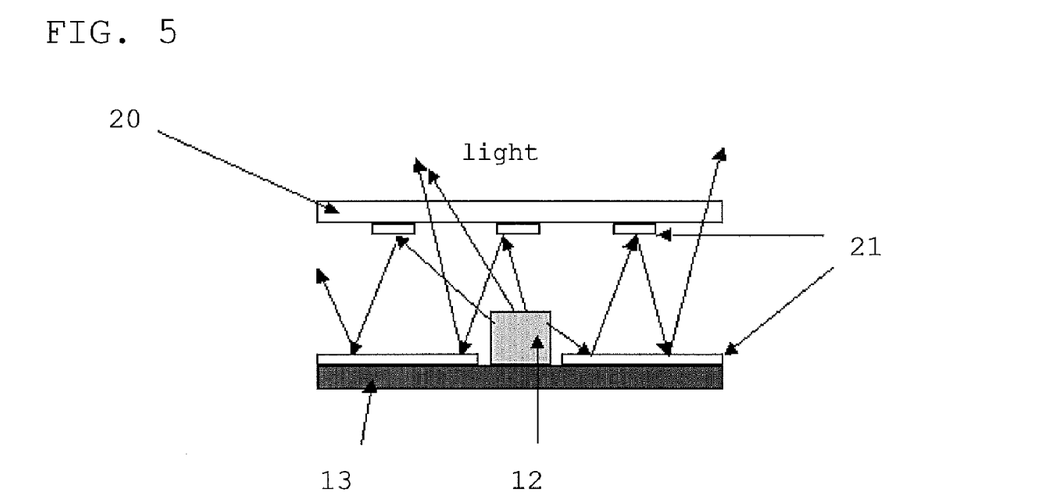
FIG. 5 is a side view schematically showing a reflection board for light emitting device.

FIGS. 4 and 5 show a reflection board for light emitting devices such as LED and EL formed by the following process. Namely, a reflection board for light emitting device shown in FIGS. 1 and 2, and FIGS. 3A-3D is first formed. Then, a reflection board in which a white hardening resin composition was coated in a specific pattern on a transparent material such as glass, polyethylene terephthalate and polyethylene naphthalate is produced. The transparent substrate is overlapped on the reflection board for light emitting device. By the above mode, a uniform lighting intensity can be achieved by diffusion of light to be taken.

Additionally, in any mode described above, a white hardening resin composition (hardened material) is supposed to be exposed to the light and heat irradiated from a light emitting device, which is a deterioration factor such as yellowing. Even in such situation, the white hardening resin composition and its hardened material according to the embodiment of the present invention can hold a high reflectivity for a long period of time.

EXAMPLES

Next, the embodiment of the present invention will be specifically explained by showing Examples, but it goes without saying that the present invention is not limited to the following Examples.

Each component was mixed by a three roll mill in accordance with Table 1-1 and Table 1-2, and each resin composition (Composition Examples 1 through 12) was obtained. Additionally, Composition Examples 1 through 6 are heat hardening resin compositions and Composition Examples 7 through 12 are light hardening resin compositions. Numbers in the tables represent part by mass.

TABLE 1-1

| | (Composition Example) | | | | | |
|---|---|---|---|---|---|---|
| | Example 1 | Example 2 | Example 3 | Example 4 | Example 5 | Example 6 |
| Bisphenol epoxy resin (B-1-1)*1 | 500 | 500 | 500 | 500 | 500 | 500 |
| Bisphenol epoxy resin (B-1-2)*2 | 500 | 500 | 500 | 500 | 500 | 500 |
| Curing catalyst (D-2)*3 | 30 | 30 | 30 | 30 | 30 | 30 |
| Chlorine-method rutile-type titanium oxide (A-1)*4 | 1000 | — | — | — | — | — |
| Chlorine-method rutile-type | — | 1000 | — | — | — | — |

TABLE 1-1-continued (Composition Example)

| | Example 1 | Example 2 | Example 3 | Example 4 | Example 5 | Example 6 |
|---|---|---|---|---|---|---|
| titanium oxide (A-2)*[5] | | | | | | |
| Sulfuric acid-method rutile-type titanium oxide (A-3)*[6] | — | — | 1000 | — | — | — |
| Sulfuric acid-method rutile-type titanium oxide (A-4)*[7] | — | — | — | 1000 | — | — |
| Anatase-type titanium oxide*[8] | — | — | — | — | 1000 | — |
| Anatase-type titanium oxide*[9] | — | — | — | — | — | 1000 |
| Organic bentonite*[10] | 10 | 10 | 10 | 10 | 10 | 10 |
| Defoaming agent*[11] | 5 | 5 | 5 | 5 | 5 | 5 |
| Organic solvent DPM*[12] | 150 | 150 | 150 | 150 | 150 | 150 |

(Remark)
*[1]Epicoat 828: manufactured by Japan Epoxy Resins Co., Ltd.
*[2]Epicoat 807: manufactured by Japan Epoxy Resins Co., Ltd.
*[3]2MZ-A (2,4-diamino-6-[2'-methylimidazolyl-(1')]-ethyl-s-triazine), manufactured by Shikoku Chemicals Corporation
*[4]Tipaque CR-90 (Chlorine-method rutile-type titanium oxide): manufactured by Ishihara Sangyo Kaisha Ltd.
*[5]Tipaque CR-58 (Chlorine-method rutile-type titanium oxide): manufactured by Ishihara Sangyo Kaisha Ltd.
*[6]Tipaque R-820 (Sulfuric acid-method rutile-type titanium oxide): manufactured by Ishihara Sangyo Kaisha Ltd.
*[7]R-62N (Sulfuric acid-method rutile-type titanium oxide): manufactured by Sakai Chemical Industry Co., Ltd.
*[8]A-190 (Anatase-type titanium oxide): manufactured by Sakai Chemical Industry Co., Ltd.
*[9]Tipaque A-220 (Anatase-type titanium oxide): manufactured by Ishihara Sangyo Kaisha Ltd.
*[10]Bentone 38: manufactured by Elemetis Inc,
*[11]BYK-057: manufactured by Big Chemi Co., Ltd.
*[12]Dipropylene glycol monomethyl ether

TABLE 1-2

(Composition Example)

| | Example 7 | Example 8 | Example 9 | Example 10 | Example 11 | Example 12 |
|---|---|---|---|---|---|---|
| Epoxy acrylate (B-2-a1)*[1] | 550 | 550 | 550 | 550 | 550 | 550 |
| TMPTA (B-2-a2)*[2] | 250 | 250 | 250 | 250 | 250 | 250 |
| Phosphorous-containing methacrylate (B-2-a3)*[3] | 50 | 50 | 50 | 50 | 50 | 50 |
| Acrylate monomer (B-2-a4)*[4] | 150 | 150 | 150 | 150 | 150 | 150 |
| 2-Ethyl anthraquinone (B-2-b) | 50 | 50 | 50 | 50 | 50 | 50 |
| Chlorine-method rutile-type titanium oxide (A-1)*[5] | 1000 | — | — | — | — | — |
| Chlorine-method rutile-type titanium oxide (A-2)*[6] | — | 1000 | — | — | — | — |
| Sulfuric acid-method rutile-type titanium oxide (A-3)*[7] | — | — | 1000 | — | — | — |
| Sulfuric acid-method rutile-type titanium oxide (A-4)*[8] | — | — | — | 1000 | — | — |
| Anatase-type titanium oxide*[9] | — | — | — | — | 1000 | — |
| Anatase-type titanium oxide*[10] | — | — | — | — | — | 1000 |
| Organic bentonite*[11] | 10 | 10 | 10 | 10 | 10 | 10 |
| Defoaming agent*[12] | 5 | 5 | 5 | 5 | 5 | 5 |

(Remark)
*[1]Bisphenol A type epoxy acryalte: manufactured by Mitsubishi Chemical Corporation
*[2]TMPTA: Trimethylolpropane triacrylate
*[3]Kamaya PM2: manufactured by Nippon Kayaku Co., Ltd.
*[4]Light ester HO: manufactured by Kyoei Kagaku Kogyo Co., Ltd.
*[5]CR-90 (Chlorine-method rutile-type titanium oxide): manufactured by Ishihara Sangyo Kaisha Ltd.
*[6]CR-58 (Chlorine-method rutile-type titanium oxide): manufactured by Ishihara Sangyo Kaisha Ltd.
*[7]R-820 (Sulfuric acid-method rutile-type titanium oxide): manufactured by Ishihara Sangyo Kaisha Ltd.
*[8]R-62N (Sulfuric acid-method rutile-type titanium oxide): manufactured by Sakai Chemical Industry Co., Ltd.
*[9]A-190 (Anatase-type titanium oxide): manufactured by Sakai Chemical Industry Co., Ltd.
*[10]Tipaque A-220 (Anatase-type titanium oxide): manufactured by Ishihara Sangyo Kaisha Ltd.
*[11]Bentone 38: manufactured by Elemetis Inc,
*[12]BYK-057: manufactured by Big Chemi Co., Ltd.

Performance Evaluation
(Production of Board for Evaluating Coated Film Characteristics)

Composition Examples 1 to 6

Hardening resin compositions of Examples 1 to 6 were each pattern-printed on a FR-4 substrate of flat copper by screen printing for a dried coated film to be about 20 μm, followed by heating at 150° C. for 60 minutes to harden, and a test piece was obtained.

Composition Examples 7 to 12

Hardening resin compositions of Examples 7 to 12 were each pattern-printed on a FR-4 substrate of flat copper by screen printing for a dried coated film to be about 20 μm, and irradiated at a wavelength of 350 nm by an integrated light intensity of 2 J/cm² with a metal halide lamp to harden, and a test piece was obtained.

The test piece obtained was evaluated for the characteristics as follows.

(1) Light Resistance

For each test piece, using a color-difference meter, CR-400 manufactured by Minolta Co., Ltd., the initial value of Y value in XYZ color coordinate system, and the initial values of L*, a* and b* in L*, a* and b* color coordinate system were measured. Thereafter, each test piece was deteriorated at an accelerating rate by irradiating light of 150 J/cm² in an UV conveyer furnace (output 150 W/cm, metal halide lamp, cold mirror), again, each value was measured using a color-difference meter CR-400 manufactured by Minolta Co., Ltd., evaluation was made by the change of Y value and ΔE*ab. The result is shown together with the evaluation result on change in color by naked eye in Table 2-1 and Table 2-2.

(2) Heat Resistance

For each test piece, using a color-difference meter CR-400 manufactured by Minolta Co., Ltd., the initial value of Y value in XYZ color coordinate system, and the initial values of L*, a* and b* in L*, a* and b* color coordinate system were measured. Thereafter, each test piece was deteriorated at an accelerating rate by leaving it in a hot air circular drying furnace at 150° C. for 50 hours, again, each value was measured using a color-difference meter, CR-400 manufactured by Minolta Co., Ltd., evaluation was made by the change of Y value and ΔE*ab. The result is shown together with the evaluation result on change in color by naked eye in Table 2-1 and Table 2-2.

Y value is a value of Y in XYZ color coordinate system, and the larger the numeric value is, the higher the reflectivity shows. ΔE*ab is the difference calculated between the initial value in L*, a* and b* color coordinate system and the value after accelerated deterioration, and the larger the numeric value is, the larger the change in color shows. The calculation formula of ΔE*ab is as follows.

$$\Delta E^*ab = ((L^*2-L^*1)^2 + ((a^*2-a^*1)^2 + ((b^*2-b^*1)^2)^{0.5}$$

wherein L*1, a*1 and b*1 represent initial values of L*, a* and b*, respectively, L*2, a*2 and b*2 represent values of L*, a* and b* after accelerated deterioration, respectively.

Evaluation criteria of visual evaluation are as follows.

○: there is no change in color at all.

Δ: there is somewhat change in color.

x: there is change in color.

(3) Solvent Resistance

Each test piece was immersed in propylene glycol monomethyl ether acetate for 30 minutes, and dried, then change in color was observed by naked eye, further, presence of peeling by tape peel was confirmed. Evaluation criteria are as follows.

○: there is neither peeling nor change in color.

x: there is peeling or change in color.

The result is shown in Table 3-1 and Table 3-2.

(4) Solder Heat Resistance

The presence of peeling of coated film was confirmed as follows: each test piece coated with rosin-based flux was flowed in a solder bath previously set at 260° C., washed with propylene glycol monomethyl ether acetate and dried, then, a peel test was done using a cellophane adhesive tape, and presence of peeling of coated film was confirmed. Evaluation criteria are as follows.

○: there is no peeling.

x: there is peeling.

TABLE 2-1

| | (Composition Example) | | | | | |
|---|---|---|---|---|---|---|
| | Example 1 | Example 2 | Example 3 | Example 4 | Example 5 | Example 6 |
| Y (Initial value) | 82.1 | 80.9 | 77.3 | 76.0 | 78.7 | 81.1 |
| (1)Light resistance Y | 81.0 | 79.8 | 76.4 | 74.3 | 63.5 | 64.7 |
| ΔE*ab | 0.9 | 0.9 | 1 | 1.1 | 4.6 | 6.5 |
| Visual evaluation | ○ | ○ | ○ | ○ | x | x |
| (2)Heat resistance Y | 78.5 | 77.3 | 74.2 | 73.1 | 67.6 | 68.9 |
| ΔE*ab | 0.9 | 0.9 | 1.5 | 1.7 | 2.5 | 2.2 |
| Visual evaluation | ○ | ○ | Δ | Δ | x | x |

TABLE 2-2

| | (Composition Example) | | | | | |
|---|---|---|---|---|---|---|
| | Example 7 | Example 8 | Example 9 | Example 10 | Example 11 | Example 12 |
| Y (Initial value) | 82.5 | 83.9 | 76.8 | 74.2 | 77.4 | 82.0 |
| (1)Light resistance Y | 81.4 | 82.7 | 75.4 | 72.3 | 65.8 | 67.1 |
| ΔE*ab | 0.9 | 1 | 1.2 | 1.1 | 3.7 | 7.5 |
| Visual evaluation | ○ | ○ | ○ | ○ | x | x |
| (2)Heat resistance Y | 79.7 | 80.2 | 74.7 | 72 | 67.2 | 70.5 |
| ΔE*ab | 0.9 | 1 | 1.5 | 1.8 | 2.7 | 2.6 |
| Visual evaluation | ○ | ○ | Δ | Δ | x | x |

The result is shown in Table 3-1 and Table 3-2.

(5) Pencil Hardness

Tips of pencils of B to 9H being sharpened in a flat tip were pressed down on each test piece at an angle of 45°, and hardness of the hardest pencil that coated film was not peeled was recorded. The result is shown in Table 3-1 and Table 3-2.

(6) Electrical Insulating Properties

Using a FR-4 substrate that comb-shaped electrodes of B pattern of IPC specification were formed in place of the copper foil substrate, it was pattern-printed by screen printing for a dried coated film to be about 20 μm in the same manner as described above, followed by heating at 150° C. for 60 minutes to harden, and a test piece was obtained. The insulation resistance value between the electrodes of each test piece was measured at an applied voltage of 500 V. The result is shown in Table 3-1 and Table 3-2.

TABLE 3-1

| | (Composition Example) | | | | | |
|---|---|---|---|---|---|---|
| | Example 1 | Example 2 | Example 3 | Example 4 | Example 5 | Example 6 |
| (3) Solvent resistance | ○ | ○ | ○ | ○ | ○ | ○ |
| (4) Solder heat resistance | ○ | ○ | ○ | ○ | ○ | ○ |
| (5) Pencil hardness | 6H | 6H | 6H | 6H | 6H | 6H |
| (6) Electrical insulating properties | $10^{13}$ | $10^{13}$ | $10^{13}$ | $10^{13}$ | $10^{13}$ | $10^{13}$ |

TABLE 3-2

| | (Composition Example) | | | | | |
|---|---|---|---|---|---|---|
| | Example 7 | Example 8 | Example 9 | Example 10 | Example 11 | Example 12 |
| (3) Solvent resistance | ○ | ○ | ○ | ○ | ○ | ○ |
| (4) Solder heat resistance | ○ | ○ | ○ | ○ | ○ | ○ |
| (5) Pencil hardness | 6H | 6H | 6H | 6H | 6H | 6H |
| (6) Electrical insulating properties | $10^{13}$ | $10^{13}$ | $10^{13}$ | $10^{13}$ | $10^{13}$ | $10^{13}$ |

As is clear from the results shown in Table 2-1, Table 2-2, Table 3-1 and Table 3-2, it is known that the white hardening resin composition according to the embodiment of the present invention satisfies various characteristics generally required for an insulation layer of a printed-wiring board, and maintains a high reflectivity and suppresses change in color after accelerated deterioration by light and heat. Compared with the case of using anatase-type titanium oxide, it goes without saying that light resistance and heat resistance are markedly improved in the embodiment of the present invention, in particular, heat resistance is further improved compared with the case of using rutile-type titanium oxide by a sulfuric acid method.

Since the white hardening resin composition according to the embodiment of the present invention has a characteristic for maintaining a high reflectivity generally required as a reflection board for light emitting device and suffering no light deterioration and heat deterioration and stable for a long period of time, when it is applied to a reflection board for light emitting devices such as EL and LED, it is possible to obtain a reflection board for light emitting devices such as EL and LED excellent in maintaining a high reflectivity and suffering no light deterioration and heat deterioration and stable for a long period of time.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A white hardening resin composition comprising:
   rutile-type titanium oxide produced by a chlorine method; and
   a hardening resin, wherein the hardening resin comprises at least one of a heat hardening resin and a light hardening resin.

2. The white hardening resin composition according to claim 1, wherein a compounding ratio of mass of the rutile-type titanium oxide to mass of the hardening resin is at least about 30 and at most about 600 to 100.

3. The white hardening resin composition according to claim 1, wherein the heat hardening resin comprises at least one of an epoxy compound and an oxcetane compound.

4. The white hardening resin composition according to claim 1, wherein the light hardening resin comprises a compound having an ethylenically unsaturated bond.

5. The white hardening resin composition according to claim 1, further comprising at least one of a hardener and a curing catalyst.

6. A hardened material comprising:
   a substrate; and
   a white hardened resin provided on the substrate in such a manner that a white hardening resin composition coated on the substrate is hardened to be the white hardened resin, the white hardening resin composition comprising:
   rutile-type titanium oxide produced by a chlorine method; and
   a hardening resin.

7. A printed-wiring board comprising:
   an insulation layer comprising:
   the hardened material according claim 6.

8. A reflection board for light emitting device comprising:
   the hardened material according claim 6.

9. The reflection board according to claim 8, wherein the reflection board is for electroluminescence.

10. The reflection board according to claim 8, wherein the reflection board is for light emitting diode.

11. A device comprising:
    a substrate;
    a light emitting diode on the substrate; and
    an insulating layer on the substrate, the insulating layer comprising a resin and a rutile-type titanium dioxide produced by a chlorine method, whereby the titanium dioxide prevents discoloration of the resin caused by light and/or heat irradiated by the light emitting device.

* * * * *